United States Patent
Itoh

(10) Patent No.: US 6,261,634 B1
(45) Date of Patent: *Jul. 17, 2001

(54) APPARATUS AND METHOD FOR FORMING FILM

(75) Inventor: Kenji Itoh, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/233,144

(22) Filed: Jan. 11, 1999

Related U.S. Application Data

(62) Division of application No. 08/907,919, filed on Aug. 11, 1997, now Pat. No. 5,879,741, and a continuation of application No. 08/614,952, filed on Mar. 12, 1996, now abandoned, and a continuation of application No. 08/216,311, filed on Mar. 23, 1994, now abandoned.

(30) Foreign Application Priority Data

Mar. 24, 1993 (JP) .......................................... 5-89116

(51) Int. Cl.⁷ .......................... C23C 16/00; C23C 14/56
(52) U.S. Cl. ................ 427/172; 427/171; 427/255.5; 427/248.1; 427/249; 427/536; 427/562; 204/298.05; 204/298.24; 118/723 E; 118/718
(58) Field of Search .................. 118/723 E, 718; 204/298.05, 298.24; 427/536, 562, 171, 172, 209, 255.5, 249, 248.1

(56) References Cited

U.S. PATENT DOCUMENTS

| | | | |
|---|---|---|---|
| 4,440,107 | 4/1984 | Doehler et al. | 118/723 E X |
| 4,446,816 | 5/1984 | Kitamoto et al. | 118/718 |
| 4,451,501 * | 5/1984 | Nagao et al. | 427/531 |
| 4,920,917 | 5/1990 | Nakatani et al. | 118/723 E X |
| 4,960,072 | 10/1990 | Ohta et al. | 204/298.05 X |
| 5,140,938 | 8/1992 | Kasanuki et al. | 118/718 |
| 5,224,441 * | 7/1993 | Felts et al. | 118/718 |
| 5,879,741 * | 3/1999 | Itoh | 427/172 |

FOREIGN PATENT DOCUMENTS

| | | | |
|---|---|---|---|
| 53-75179 | 7/1978 | (JP) | 204/298.05 |
| 60-239714 | 11/1985 | (JP) | 204/298.05 |
| 61-67765 | 4/1986 | (JP) | 204/298.05 |
| 63-9013 | 2/1988 | (JP) | 204/298.05 |

* cited by examiner

Primary Examiner—Rodney McDonald
(74) Attorney, Agent, or Firm—Nixon Peabody LLP; Jeffrey L. Costellia

(57) ABSTRACT

When a thin film is formed on a flexible and filmy substrate by a vapor phase method, the substrate is prevented from warping to be caused by the internal stress remaining in the thin film. When the thin film is formed by the vapor phase method, the substrate is previously curved so that the stress acts in the direction canceling the internal stress remaining in the thin film to be formed prior to the filming. Accordingly, the stress of the curved substrate cancels out the stress remaining in the thin film formed on the substrate. The substrate having a thin film formed thereon is not warped, the stress in the interface between the thin film formed and the substrate is removed, and the thin film has no cracks to be caused by the stress.

20 Claims, 4 Drawing Sheets

APPARATUS AND METHOD FOR FORMING FILM

This application is a Divisional Application of Ser. No. 08/907,919, filed Aug. 11, 1997, now U.S. Pat. No. 5,879,741 which is itself is a Continuation Application of Ser. No. 08/614,952, filed Mar. 12, 1996, now abandoned, which is itself a Continuation Application of Ser. No. 08/216,311, filed Mar. 23, 1994, now abandoned.

FIELD OF THE INVENTION

The present invention relates to an apparatus and a method of forming a thin film having small residual stress and good adhesion to a substrate having the film thereon.

BACKGROUND OF THE INVENTION

It is conventionally known that as methods of forming a thin film, typically, a sputtering method, an ionized vapor deposition method, etc. are used in the PVD field and a plasma CVD method is employed in the CVD field.

FIG. 1 shows a CVD apparatus using a high-frequency glow discharge of a capacitive coupled type. A high-frequency power system (5), a high-frequency power supply electrode (1), an opposed ground electrode (2), a substrate (3) having a surface on which a thin film is formed, and a plasma region (4) generated between the flat electrodes (1) and (2) installed in parallel are designated. This manner as shown in FIG. 1 is to form a film using a self bias acting in the side of the substrate (3) installed in the side of the high-frequency power supply electrode (1).

Also, FIG. 2 shows an inductive coupled CVD apparatus. In this manner as shown in FIG. 2, a plasma region (4) is formed by applying an induction energy from a coil (6) for high-frequency excitation and ions of a material activated in the plasma region are introduced into a filmy substrate (3) by an electric field from an auxiliary electrode for applying an external bias and a thin film is formed on the flexible substrate (3). Also, this manner is to move the filmy substrate sequentially by a cylindrical roller and a guide roller and form a thin film sequentially on the substrate (3).

When a thin film having a large compressive residual stress, typically such as a thin film of diamond-like carbon, is formed using the CVD apparatus as shown in FIG. 1, force by which the formed film is warped with the surface upwardly curved to a protrusion shape is applied to the thin film since the diamond-like carbon thin film has a large compressive stress of the order of $10^{10}$ dyne/cm$^2$.

The above condition will be described in FIG. 5. FIG. 5(A) shows the condition in which a thin film (13) having a compressive residual internal stress is formed on a substrate (3). When the compressive residual internal stress acts on the thin film (13), the thin film (13) tends to warp as shown in the drawing. In this case, of course, a stress occurs between the thin film (13) and the substrate (3), and thereby problems such as the decrease in adhesion of the thin film (13) to the substrate (3) or the cracking or peeling of the film (13) occur.

When a flexible and filmy substrate is used as the substrate, particularly, the thin film will curl outwardly and the substrate will curl inwardly.

Also, when the CVD apparatus shown in FIG. 2 is used, the compressive residual stress in the longitudinal direction of the movement of the substrate (3) is canceled by winding the substrate. Though any significant problem does not occur in this case, the substrate will still curl after forming the film thereon due to the compressive residual internal stress in the transverse direction of the substrate (3).

The compressive residual stress in the transverse direction of the substrate (3) cannot easily be restored to its original condition even if corrections are performed later. Even if the compressive residual stress be restored to its original condition, now the stress still remains in the interface between the thin film and the substrate, and cracking, peeling, etc. are induced due to the stress. Taking the long view, therefore, the CVD apparatus in FIG. 2 is lacking in the reliability.

The above problems occur more or less in the thin film formed by the CVD (chemical vapor deposition) method.

SUMMARY OF THE INVENTION

Accordingly, it is an object of the present invention to solve the problems of the residual stress of the thin film formed by the vapor phase method as described above.

The present invention is summarized in an apparatus of forming a thin film on a substrate by a vapor phase method, characterized in that the substrate is curved in the direction canceling of the internal stress remaining in the thin film after the formation.

In the present invention as above, the vapor phase method designates a sputtering method, an evaporation method and a CVD method. Also, all the well-known thin films such as diamond-like carbon thin film, semiconductor thin film, insulator thin film, a conductive film, etc. may be generally used as a kind of thin film.

Curving the substrate in the direction canceling the internal stress means that the substrate is previously warped in the direction opposite to the direction of the substrate itself warping due to the internal stress remaining in the thin film to be formed thereon. In this manner, when the substrate is warped due to the residual internal stress of the thin film, the previously applied warp of the substrate cancels out the warp of the thin film formed thereon and, as a result, an integrated article composed of the thin film and the substrate with no warp can be obtained.

The function of curving the substrate designates a substrate holding means or substrate carrying means for forcibly curving the substrate, and a means for curving the substrate by moving the substrate along a curved member. The present invention can be applied to all the thin films having a compressive or tensile residual internal stress.

An example of the procedures for carrying out the present invention will be described below.

(a) A residual internal stress of the thin film is formed previously measured or a degree of the curling of the substrate to be generated by forming a thin film thereon is quantitatively examined.

(b) A film is formed while providing the curvature corresponding to the deformation caused by the residual internal stress of the thin film to the substrate.

By adopting the above process, the substrate on which a flat thin film has been formed can be obtained.

The condition of the thin film obtained by utilizing the present invention will be simply indicated in FIG. 5(B). When a thin film (13) having a compressive residual internal stress is formed on the surface of a flexible and filmy substrate (3), the substrate (3) tends to warp due to the compressive stress as shown in FIG. 5(A). As illustrated here, warping the substrate in the direction reverse to the condition shown in FIG. 5(A) during the filming, the stress caused by the warp of the substrate cancels out the compressive residual internal stress of the thin film formed, and the condition as indicated in FIG. 5(B) can be realized. Further, it is important to use the radius of curvature not inducing wrinkles, flaws, etc. on the film, as the curvature to be previously applied to the substrate, during the filming.

Previously applying the stress capable of canceling the internal stress of the formed thin film to the substrate of which the surface is to be coated with the film, prior to the filming, the internal stress of the thin film can be canceled and thus the deformation of the substrate caused by forming the thin film thereon (that is, the curling phenomenon occurring in a flexible and filmy substrate) can be prevented or reduced beforehand.

BRIEF DESCRIPTION OF THE DRAWINGS

The above and other objects of the invention will be seen by reference to the description taken in connection with the accompanying drawings, in which.

DESCRIPTION OF THE PREFERRED EMBODIMENTS

While the embodiments described below represent examples in which a thin film of diamond-like carbon is formed on a filmy substrate, it is to be understood that the material of the substrate is not limited as long as a material capable of providing the curvature is used and further the present invention may be utilized in forming a thin film on a substrate, if an internal stress remaining in the thin film formed causes some troubles. Though the embodiments described below represent the examples of forming a thin film having a compressive residual internal stress, the curvature may be applied inversely when a thin film having a tensile residual internal stress is to be formed.

EXAMPLE 1

One embodiment of the present invention will be described with reference to FIGS. 3 and 4.

Figure 3:
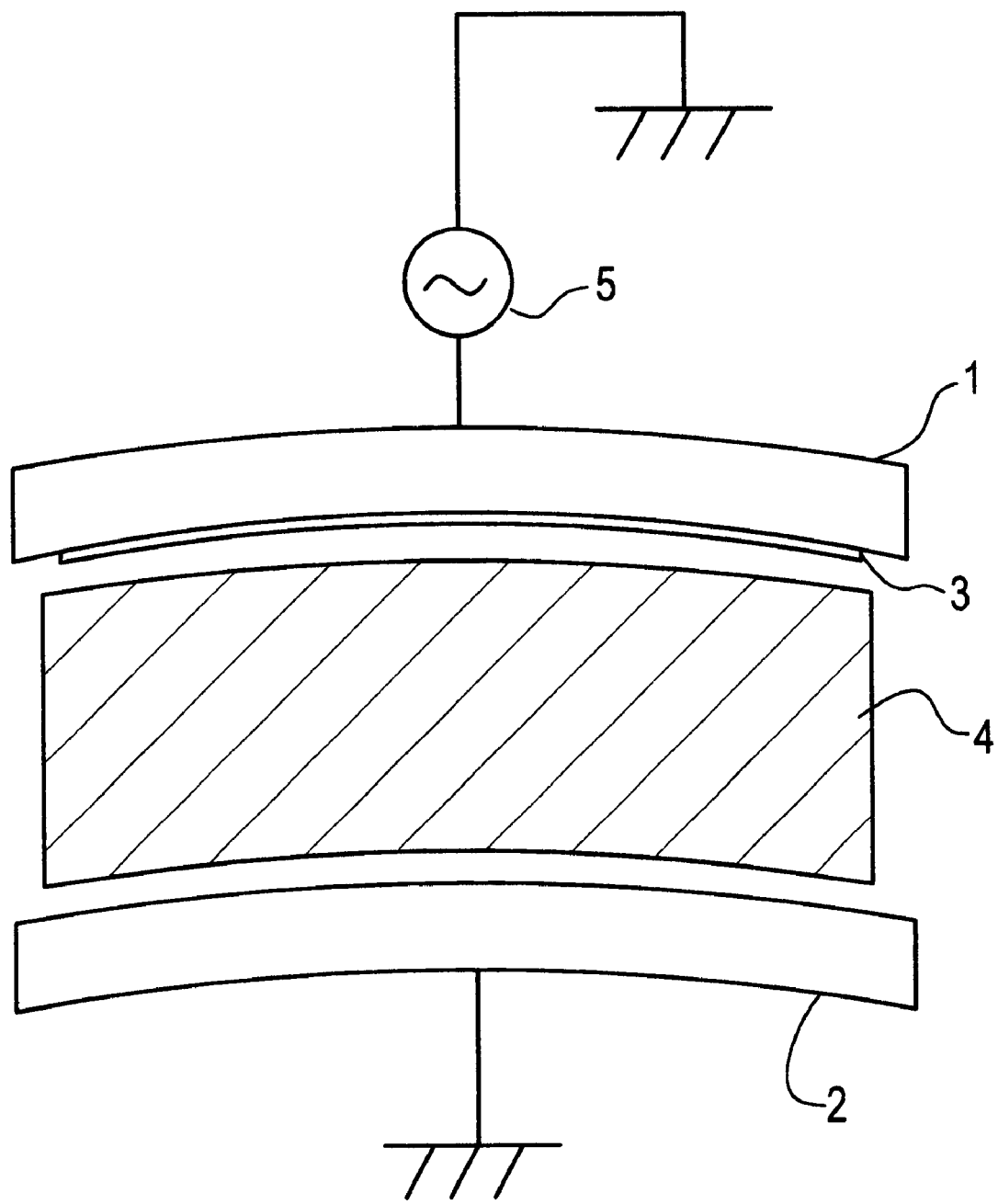
FIG. 3 is a sectional view of the internal structure in the proximity of electrodes of a thin film of diamond-like carbon forming apparatus for carrying out the embodiments of the present invention.
Figure 4:
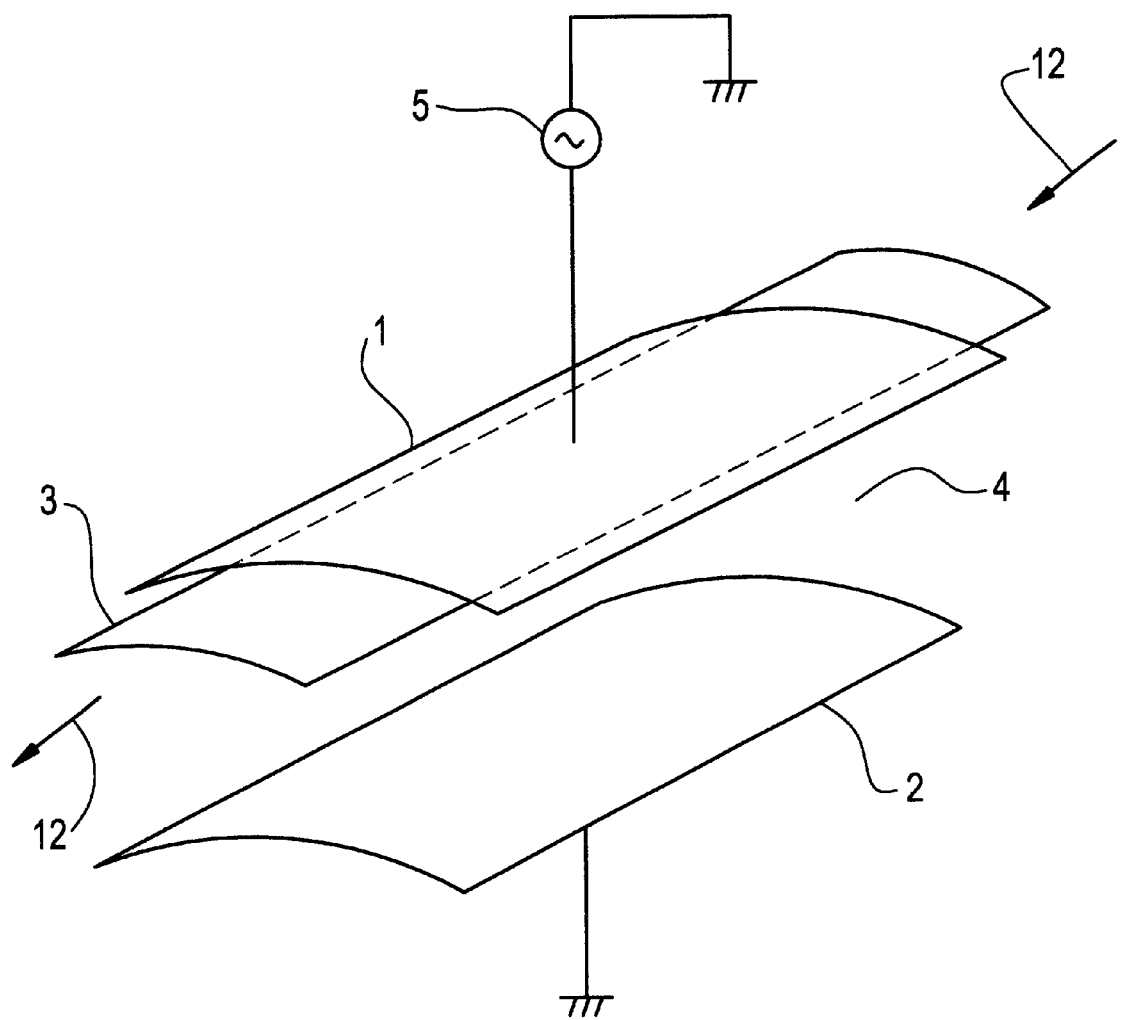
FIG. 4 is a sectional view of the internal structure in the proximity of electrodes of the same diamond-like carbon thin film forming apparatus for carrying out the embodiments of the present invention.

FIGS. 3 and 4 show a high-frequency plasma CVD apparatus having a parallel plate structure of a roll-to-roll type and capacitive coupled type. FIG. 4 is a sectional view of the apparatus stereographically seen from the oblique direction. FIG. 3 is a sectional view of the apparatus as seen from the direction perpendicular to the direction (indicated by arrow (12)) feeding of a filmy substrate.

Referring to FIGS. 3 and 4, a high-frequency power system (5) using 13.56 MHz, a filmy flexible substrate (3), a high-frequency power supply electrode (1), an opposed ground electrode (2), a plasma region (4), and the direction (12) feeding of substrate are designated.

In this apparatus, the properties of the film to be formed are determined by controlling the self bias acting in the side of the high-frequency power supply electrode (1), and the apparatus is driven by a simple construction system in which it is not necessary to specially apply a bias etc. from the outside. Of course, another construction in which a DC bias is applied from the outside may be adopted.

In the Example 1, a PET (polyethylene terephthalate) with a thickness of 10 μm, a width of 130 mm and a length of 90 m was used as the filmy substrate (3).

The high-frequency power supply electrode (1) has a width of 180 mm, a length of 250 mm and a thickness of 20 mm. As shown in FIG. 3, a radius of curvature of 360 mm is provided in the transverse direction (the horizontal direction of the paper of FIG. 3) of the electrode (1), and the electrode (1) is curved.

Also, the opposed ground electrode (2) has the same size as the high-frequency power supply electrode (1) and the radius of curvature of 360 mm equal to that of the electrode (1) is provided in the same direction as the electrode (1).

A thin film is formed while the filmy substrate (3) is moved in the direction indicated by the arrow (12) in FIG. 4 at a speed of 50 m/min. During the filming, the substrate (3) is curved according to the curvature of the high-frequency power supply electrode (1) as shown by (3) in FIG. 3 since the substrate (3) travels along the high-frequency power supply electrode (1).

Figure 5A:
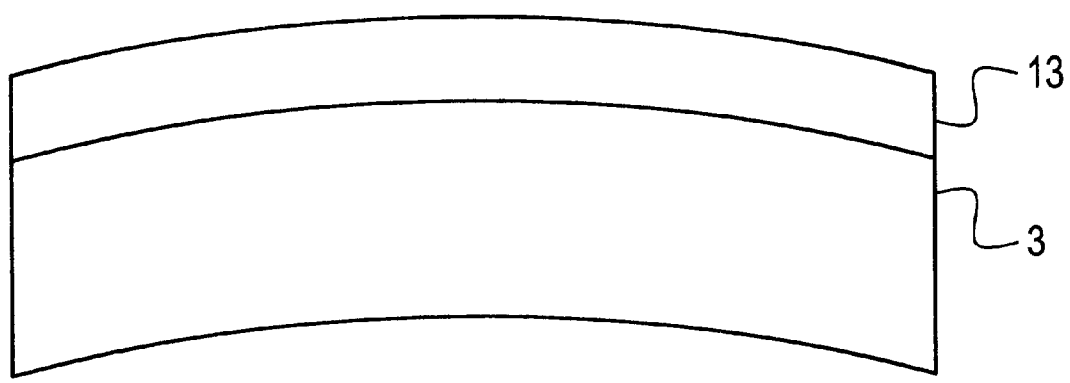
FIG. 5 is a schematic sectional view comparing the condition of a conventional film (A) with the condition of the film (B) obtained by the present invention.
Figure 5B:
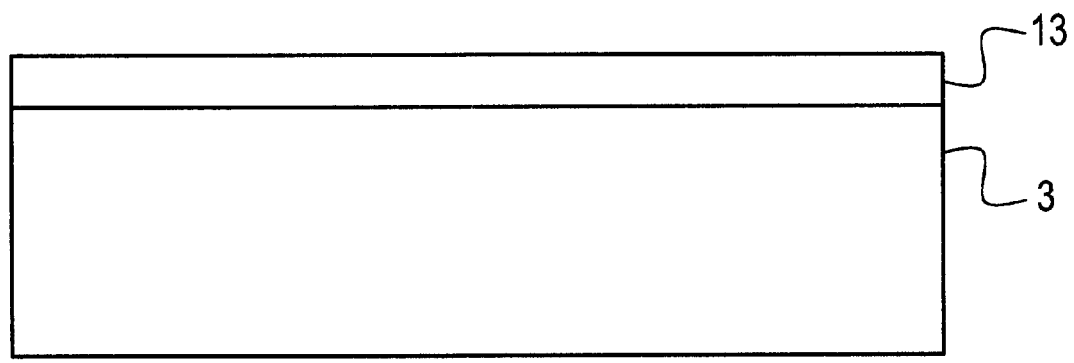

In this manner as stated above, previously curving the substrate in the. direction reverse to the warping direction of the thin film (13) of FIG. 5(A) which tends to warp as shown in the same FIG. 5(A), the residual stress of the thin film (13) formed can be canceled.

Using the plasma CVD apparatus constructed as described above, a thin film of diamond-like carbon with a thickness of 500 A was formed on the substrate (3).

Figure 1:
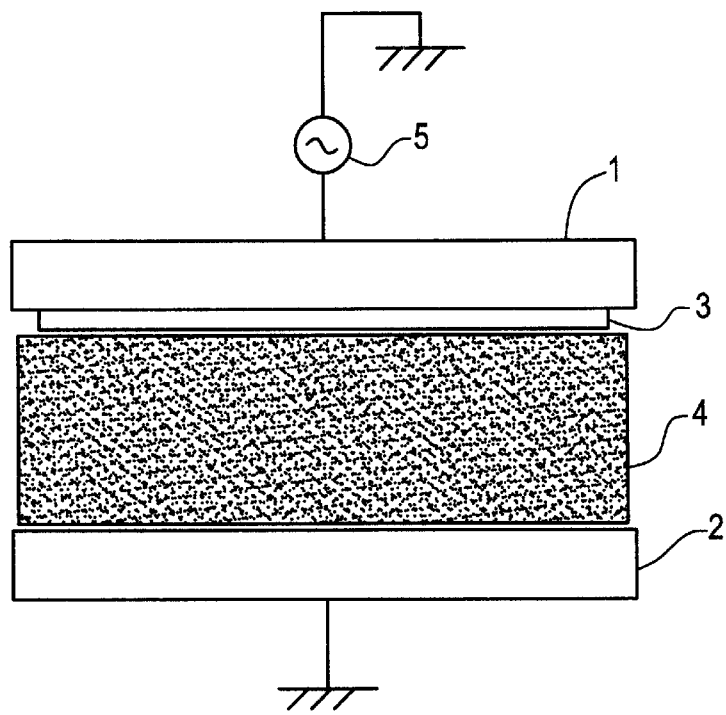
FIG. 1 is a sectional view of the internal structure of a capacitive coupled high-frequency plasma CVD apparatus of a parallel plate type.

The conditions for forming the diamond-like carbon thin film are the same as those for forming the same thin film, but having a compressive residual internal stress of $1.7 \times 10^{10}$ dyne/cm$^2$, using the conventional apparatus as shown in FIG. 1.

Concretely, the conditions for forming the film were as follows:

| | |
|---|---|
| Input power: | 1.5 Kw |
| Pressure of forming film: | 80 Pa |
| Substrate gap: | 15 mm |
| Substrate temperature: | no heating |
| Gas for forming film: | $C_2H_6 + H_2$ (200 sccm/50 sccm) |

As a result of a visual examination of the film recovered by a winding roll, a flat condition before forming the thin film was maintained, and concerning physical properties of the diamond-like carbon thin film, the peeling did not occur at all and the entire uniformity was obtained. Also, with reference to the hardness, though the measurement of the Vickers hardness of the film formed could not be performed due to problems of the substrate and the film thickness. However, there occurred no problem of the durability of the film in the alternative test where a steel ball was moved thereon under pressure. Thus, the film formed was satisfactory.

The reason why the above result was obtained is that when the diamond-like carbon thin film having a compressive stress is formed on the surface of the substrate (3)

traveling along the curvature of the electrode (1) during the filming, the diamond-like carbon thin film tends to warp in the direction reverse to the warp of the substrate caused by the internal residual stress and as a result, the both warps are canceled out and the condition of little presence of the residual internal stress is realized.

COMPARATIVE EXAMPLE 1

In Comparative Example 1, a thin film of diamond-like carbon with a thickness of 500 Å is formed using a conventionally wellknown high-frequency plasma CVD apparatus as shown in FIG. 1 in the same film forming conditions as in the Example 1. With reference to using a film made of PET as the substrate or the size and shape of the electrodes, Comparative Example 1 is performed in the same conditions as in the Example 1. That is, Comparative Example 1 is the same as Example 1, except that a curvature is not provided to the electrode and the filmy substrate is not curved in the curvature similar to the curvature according to the electrode to which the curvature is provided.

In the thin film of diamond-like carbon obtained by Comparative Example 1, no peeling from the film occurred. However, the film itself curved noticeably and the film had a shape difficult to spontaneously restore to the flat condition if not corrected.

Also, in the durability test where a steel ball is moved on the film under pressure, the film partially peeled at the interface between the film and the substrate.

This means that a large stress occurred between the diamond-like carbon thin film and the substrate.

COMPARATIVE EXAMPLE 2

Comparative Example 2 is performed in the same conditions as in Example 1 except that the radius of curvature of the high-frequency power supply electrode (1) is 180 mm or the same as the width of the electrode (1).

In Comparative Example 2, when a thin film of diamond-like carbon was formed at a thickness of 500 Å, a restoring force of the film to which the curvature was forcibly provided was too strong during the formation, and after the formation, microcracks occurred and also the film partially peeled with the lapse of time, and hence the effect of compensating, that is, neutralizing the stress of the thin film formed was not obtained at all.

Comparative Example 2 concluded that in order to cancel the compressive residual internal stress remaining in the diamond-like carbon thin film, too large stress applied by previously curving the substrate prior to the filming caused the problem because of the remaining of the stress applied to the substrate.

Optimum Values of Radius of Curvature

The following Table 1 shows the results of the formation of a thin film of diamond-like carbon on the substrate (3), varying the curvature applied to the pair of substrates (1) and (2) and using the conditions of Example 1.

TABLE 1

| Radius of curvature (mm) | Result | Condition of coated film |
| --- | --- | --- |
| 280 | poor | Peeling of coated film partially occurred due to the restoring force of film. |

TABLE 1-continued

| Radius of curvature (mm) | Result | Condition of coated film |
| --- | --- | --- |
| 320 | good | Film was substantially flat and no peeling of coated film occurred. |
| 360 | good | Film was substantially flat and no peeling of coated film occurred. |
| 400 | good | Film was substantially flat and no peeling of coated film occurred. |
| 440 | poor | Due to stress of coated film, the film slightly curled inwardly but no peeling occurred. |

(For electrode width of 180 mm and electrode length of 250 mm)

Table 1 concludes that in the film forming conditions as shown in the Example 1, when the diamond-like carbon thin film having a compressive residual internal stress of about $1.7 \times 10^{10}$ dyne/cm$^2$ is formed on a PET film substrate, the stress remaining in the diamond-like carbon thin film can be canceled by providing a radius of curvature of about 320 to 400 mm to the PET film substrate (thickness of 10 μm, width of 130 mm and length of 90 m) in the conditions as shown by (3) in FIG. 3.

EXAMPLE 2

Example 2 indicates an example in which in the same conditions as in Example 1, expander rolls are additionally located before and after the film forming region formed by parallel plate type electrodes through which the filmy substrate travels. On the substrate is formed a thin film of diamond-like carbon having a thickness of 500 Å.

The expander rolls are an apparatus for removing deflection or wrinkles of the film by applying the tension in the transverse direction of the film.

Example 2 proved that even slight wrinkles were completely removed by expanding the filmy substrate before forming the thin, film thereon by the expander rolls and also the flatness of the filmy substrate on which the thin film was formed could be improved.

Further, physical properties of the diamond-like carbon thin film substantially similar to the above Example 1 were obtained.

When the traveling system of the substrate is long, the use of the expander rolls is extremely effective.

EXAMPLE 3

Example 3 indicates an example in which in the conventional plasma CVD apparatus as shown in FIG. 1, the same curvature of 360 mm as shown in FIG. 3 is provided to the filmy substrate (3). In the same manner as indicated in FIG. 4, the substrate (3) was moved so as to pass from one side of the plasma region (4) to the other side thereof and a thin film was formed.

Example 3 is performed in a manner of forming a thin film by providing the predetermined curvature only to the substrate in the pair of electrodes having a conventionally well-known parallel plate type structure. Example 3 is performed on the premise that a flexible tape is used as the substrate. Further, the tape substrate shall continuously pass between the electrode (1) and the electrode (2). In this case, the substrate is curved so that the stress a cts in the transverse direction (perpendicular to the curving direction) of the substrate through a substrate conveyance system and the film is formed, and thereby the effect similar to the Example 1 can be obtained.

Example 3 is characterized in that though it requires the conveyance mechanism for providing the curvature to the substrate (3), the conventional parallel plate type electrodes can be used as the electrodes.

The condition of the thin film of diamond-like carbon obtained by Example 3 was similar to that of the thin film obtained by Example 1. The thin film formed on the substrate neither peeled from the substrate nor cracked. The substrate thus coated with the thin film did nor warp. Hence, the thin film formed on the substrate was good.

EXAMPLE 4

Figure 2:
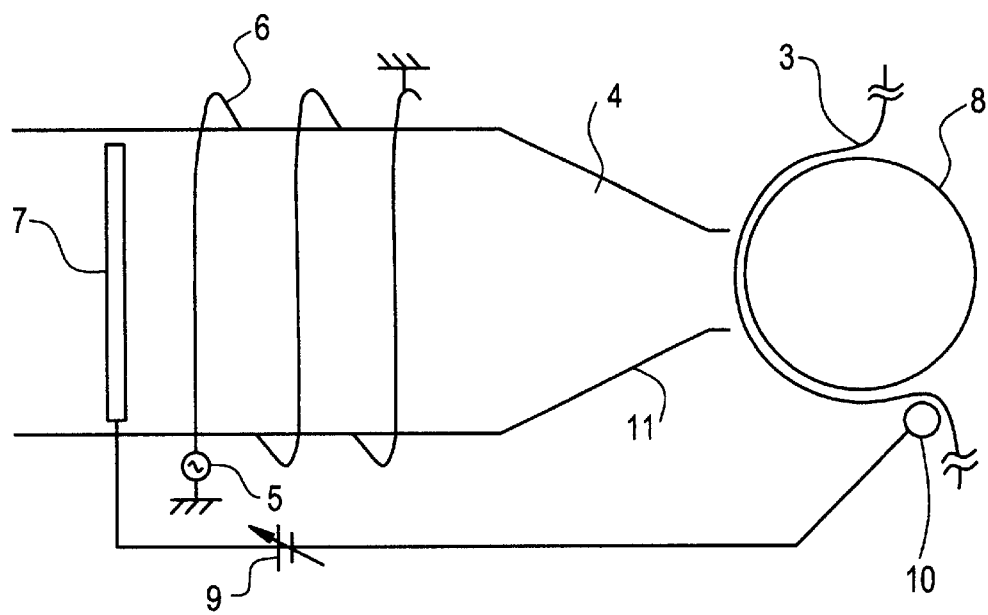
FIG. 2 is a schematic illustration of a inductive coupled high-frequency plasma CVD apparatus.

Example 4 indicates an example in which in the conventionally well-known inductive coupled type plasma CVD apparatus as shown in FIG. 2, the surface of the cylindrical can roller (8) has been made to be curved inwardly while the surface of the guide roller has been made to be curved outwardly and thereby a certain radius of curvature is provided in the transverse direction of the substrate (3) in the region in which a thin film of diamond-like carbon is to be formed and the film is formed.

Using the construction of Example 4, the residual compressive internal stress of the thus-formed thin film of diamond-like carbon can be canceled. The thin film formed is flat and is neither peeled from the substrate nor cracked.

Also, when the formed thin film has a tensile stress therein, the above construction may be reversed correspondingly. That is, the surface of the cylindrical can roller (8) is made to be curved outwardly while the surface of the guide roller is made to be curved inwardly and thereby the internal stress of the thin film can be canceled.

According to the present invention as described above, a flexible substrate is previously processed in such a way that it may have a curvature for generating the stress in the direction canceling the residual stress of a thin film to be formed thereon prior to the filming, and thereby the stress caused by the formation of a thin film on the substrate can be controlled so as to reduce and further neutralize it, that is, so as to approximate as much as possible the interface stress to zero. Hence, a flat thin film can be formed on the substrate, while maintaining the physical properties of the film and also the good adhesiveness thereof with the substrate.

What is claimed is:

1. An inductive coupled chemical vapor deposition apparatus for forming a film over a flexible substrate comprising:
    a deposition chamber;
    a coil for high frequency excitation;
    a plasma region being formed by applying an induction energy from the coil;
    an auxiliary electrode for applying an external bias and introducing material ions into the flexible substrate, said material ions being activated in the plasma region;
    a cylindrical roller for moving the flexible substrate in a first direction of curvature to provide a radius of curvature, wherein a central axis of the radius of curvature is a second direction which is the same as the first direction, said central axis being defined by connecting a center of the curvature with each other,
    wherein the first and second directions are different from the first direction of curvature, and
    wherein the flexible substrate curves in a second direction of curvature after deposition to cancel an internal stress of the film provided by the guide roller to thereby reduce warpage of the film.

2. An apparatus according to claim 1, wherein the flexible substrate comprises polyethylene terephthalate.

3. An apparatus according to claim 1, wherein the radius of curvature is in the range of 320 to 400 mm.

4. An apparatus according to claim 1, wherein the film comprises a diamond-like carbon film.

5. An apparatus according to claim 1, wherein the first and second directions are substantially perpendicular to the first direction of curvature.

6. A method for forming a film over a flexible substrate by an inductive coupled chemical vapor deposition apparatus,
    said inductive coupled chemical vapor deposition apparatus including:
        a deposition chamber;
        a coil for high frequency excitation;
        a plasma region being formed by applying an induction energy from the coil;
        an auxiliary electrode for applying an external bias and introducing material ions into the flexible substrate, said material ions being activated in the plasma region;
        a cylindrical roller for moving the flexible substrate in a first direction within the deposition chamber;
        a guide roller for curving the flexible substrate in a first direction of curvature to provide a radius of curvature,
    said method comprising the steps of:
        moving the flexible substrate in the first direction;
        curving the flexible substrate to have a radius of curvature in the first direction of curvature during moving the flexible substrate; and
        depositing the film over the flexible substrate,
        wherein a central axis of the radius of curvature is defined as a second direction which is the same as the first direction, said central axis being defined by connecting a center of the curvature with each others
        wherein the first and second directions are different from the first direction of curvature, and
        wherein the flexible substrate curves in a second direction of curvature after depositing the film to cancel an internal stress of the film provided by the curving of the flexible substrate and to thereby reduce warpage of the film.

7. A method according to claim 6, wherein the flexible substrate comprises polyethylene terephthlate.

8. A method according to claim 6, wherein the radius of curvature is in the range of 320 to 400 mm.

9. A method according to claim 6, wherein the film comprises a diamond-like carbon film.

10. A method according to claim 6, wherein the first and second directions are substantially perpendicular to the first direction of curvature.

11. A method for forming a film over a flexible substrate by an inductive coupled chemical vapor deposition apparatus,
    said inductive coupled chemical vapor deposition apparatus including:
        a deposition chamber;
        a coil for high frequency excitation;
        a plasma region being formed by applying an induction energy from the coil;
        an auxiliary electrode for applying an external bias and introducing material ions into the flexible substrate, said material ions being activated in the plasma region;
        a cylindrical roller for moving the flexible substrate in a first direction within the deposition chamber;

a guide roller for curving the flexible substrate in a first direction of curvature to provide a radius of curvature, said method comprising the steps of:
placing the flexible substrate over the cylindrical roller;
moving the flexible substrate in the first direction;
curving the flexible substrate in the first direction of curvature to have a radius of curvature during moving the flexible substrate; and
applying a tension in a transverse direction of the substrates depositing the film over the flexible substrate,
wherein a central axis of the radius of curvature is defined as a second direction which is the same as the first direction, the central axis being defined by connecting a center of the curvature with each others wherein the first and second directions are different from the first direction of curvature, and
wherein the flexible substrate curves in a second direction of curvature after depositing the film to cancel an internal stress of the film provided by the curving of the flexible substrate and to thereby reduce warpage of the film.

12. A method according to claim 11, wherein the flexible substrate comprises polyethylene terephthlate.

13. A method according to claim 11, wherein the film comprises a diamond-like carbon film.

14. A method according to claim 11, wherein the first and second directions are substantially perpendicular to the first direction of curvature.

15. An induced coupled chemical vapor deposition apparatus for forming a diamond like carbon film over a flexible substrate, said induced coupled chemical vapor deposition apparatus comprising:
a deposition chamber;
a coil for high frequency excitation;
a plasma region being formed by applying an induction energy from the coil;
an auxiliary electrode for applying an external bias and introducing material ions into the flexible substrate, said material ions being activated in the plasma region;
a cylindrical roller for moving the flexible substrate within the deposition chamber;
a guide roller for applying a tension in a transverse direction of the substrate,
wherein the flexible substrate is curved in a direction different from the transverse direction along a surface of the cylindrical roller to cancel an internal stress of the diamond like carbon film to thereby reduce warpage of the film.

16. An apparatus according to claim 15, wherein the flexible substrate is curved substantially perpendicular to the transverse direction.

17. A method for forming a film over a flexible substrate by an induced couple chemical vapor deposition apparatus, said induced couple chemical vapor deposition apparatus including:
a deposition chamber;
a coil for high frequency excitation;
a plasma region being formed by applying an induction energy from the coil;
an auxiliary electrode for applying an external bias and introducing material ions into the flexible surface, said material ions being activated in the plasma region;
a cylindrical roller having an inwardly curved surface;
a guide roller having an outwardly curved surface, said method comprising the steps of:
disposing the flexible substrate along the outwardly curved surface of the guide roller so that the flexible substrate has a certain radius of curvature;
moving the flexible substrate in a first direction; and
forming a film comprising carbon on a surface of the flexible substrate through plasma CVD,
wherein a central axis of the radius of curvature is defined as a second direction, said central axis being defined by connecting a center of the curvature with each other; wherein the first and second directions are different from the first direction of curvature;
wherein the film as deposited on the surface of the flexible substrate has a compressive stress which curves the film in a second direction of curvature sufficient to substantially cancel the compressive stress and reduce warpage of the film.

18. A method according to claim 17, wherein the film comprises a diamond-like carbon film.

19. A method for forming a film over a flexible substrate by an induced couple chemical vapor deposition apparatus, said induced couple chemical vapor deposition apparatus including:
a deposition chamber;
a coil for high frequency excitation;
a plasma region being formed by applying an induction energy from the coil;
an auxiliary electrode for applying an external bias and introducing material ions into the flexible substrate, said material ions being activated in the plasma region;
a cylindrical roller having an outwardly curved surface;
a guide roller having an inwardly curved surface,
said method comprising the steps of:
disposing the flexible substrate along the inwardly curved surface of the guide roller so that the flexible substrate has a certain radius of curvature;
moving the flexible substrate in a first direction; and
forming a film comprising carbon on a surface of the flexible substrate through plasma CVD,
wherein a central axis of the radius of curvature is defined as a second direction, said central axis being defined by connecting a center of the curvature with each other; wherein the first and second directions are different from the first direction of curvature;
wherein the film as deposited on the surface of the flexible substrate has a tensile stress which curves the film in a second direction of curvature sufficient to substantially cancel the tensile stress and reduce the warpage of the film.

20. A method according to claim 19, wherein the film comprises a diamond-like carbon film.

* * * * *